United States Patent
Bringoltz et al.

(10) Patent No.: US 12,321,102 B2
(45) Date of Patent: Jun. 3, 2025

(54) MACHINE AND DEEP LEARNING METHODS FOR SPECTRA-BASED METROLOGY AND PROCESS CONTROL

(71) Applicant: NOVA LTD., Rehovot (IL)

(72) Inventors: Barak Bringoltz, Rishon le Tzion (IL); Ran Yacoby, Jerusalem (IL); Noam Tal, Mishmar Hashivaa (IL); Shay Yogev, Kibbutz Kfar Menachem (IL); Boaz Sturlesi, Rehovot (IL); Oded Cohen, Rehovot (IL)

(73) Assignee: NOVA LTD., Rehovot (IL)

( * ) Notice: Subject to any disclaimer, the term of this patent is extended or adjusted under 35 U.S.C. 154(b) by 0 days.

(21) Appl. No.: 18/508,177

(22) Filed: Nov. 13, 2023

(65) Prior Publication Data

US 2024/0310737 A1    Sep. 19, 2024

Related U.S. Application Data

(63) Continuation of application No. 17/995,706, filed as application No. PCT/IL2021/050389 on Apr. 6, 2021, now Pat. No. 11,815,819.

(Continued)

(51) Int. Cl.
G05B 13/02    (2006.01)
G03F 7/00    (2006.01)

(52) U.S. Cl.
CPC ......... G03F 7/70508 (2013.01); G03F 7/705 (2013.01); G03F 7/70525 (2013.01);
(Continued)

(58) Field of Classification Search
CPC .. G03F 7/70508; G03F 7/705; G03F 7/70525; G05B 13/0265; G05B 2219/2602; G05B 2219/45031
See application file for complete search history.

(56) References Cited

U.S. PATENT DOCUMENTS

2008/0233662 A1    9/2008  Shen et al.
2009/0319196 A1*  12/2009  Schaller ............. G01N 21/3563
                                                                702/31
(Continued)

FOREIGN PATENT DOCUMENTS

CN    112805635 A    5/2021
WO    2017117568 A1   7/2017

OTHER PUBLICATIONS

Xu et al. "Wind Retrievalfor Cfoscat Edge and Nadir Observations Based on Neural Networks and Improved Principle Component Analysis." IGARSS 2019-2019 IEEE International Geoscience and Remote Sensing Symposium. IEEE, Nov. 28, 2019 . . . 2019 Retrieved on Jun. 6, 2021 (Jun. 6, 2021) from entire document.

*Primary Examiner* — Yuhui R Pan
(74) *Attorney, Agent, or Firm* — Reches Patents (57) ABSTRACT

A system and methods for Advance Process Control (APC) in semiconductor manufacturing include: for each of a plurality of waiter sites, receiving a pre-process set of scatterometric training data, measured before implementation of a processing step, receiving a corresponding post-process set of scatterometric training data measured after implementation of the process step, and receiving a set of process control knob training data indicative of process control knob settings applied during implementation of the process step; and generating a machine learning model correlating variations in the pre-process sets of scatterometric training data and the corresponding process control knob training data with the corresponding post-process sets of scatterometric training data, to train the machine learning model to recommend changes to process control knob settings to compensate for variations in the pre-process scatterometric data.

18 Claims, 6 Drawing Sheets

Related U.S. Application Data

(60) Provisional application No. 63/005,589, filed on Apr. 6, 2020.

(52) U.S. Cl.
CPC .. *G05B 13/0265* (2013.01); *G05B 2219/2602* (2013.01); *G05B 2219/45031* (2013.01)

(56) References Cited

U.S. PATENT DOCUMENTS

| | | |
|---|---|---|
| 2012/0226644 A1 | 9/2012 | Jin et al. |
| 2015/0323471 A1 | 11/2015 | Sapiens et al. |
| 2016/0148850 A1 | 5/2016 | David |
| 2019/0180184 A1* | 6/2019 | Deng ................. G06N 3/045 |
| 2020/0110390 A1* | 4/2020 | Banna ............. G05B 19/41875 |
| 2020/0320402 A1* | 10/2020 | Yoon ................. G06N 3/045 |

* cited by examiner

214: Receive multiple sets (vectors) of scatterometric training data (e.g., spectrograms or graphs of reflected irradiance versus an incident angle) before and after process step ($\vec{S}_{Pre}$ and $\vec{S}_{Post}$)

216: Receive knob (process control) settings $\vec{k}$ employed in process step

220: Train machine learning model (e.g., auto-encoder) with $\vec{k}$, $\vec{S}_{Pre}$ and $\vec{S}_{Post}$, to predict appropriate $\vec{k}$ for reducing variation of target pattern parameters 222: In production, apply model with $\vec{S}_{Pre}$ and target pattern parameters, to generate recommended knob settings, $\vec{k}_{recommended}$, for reducing variation of achieved pattern parameters.

MACHINE AND DEEP LEARNING METHODS FOR SPECTRA-BASED METROLOGY AND PROCESS CONTROL

FIELD OF THE INVENTION

The present invention relates generally to the field of optical inspection of integrated circuit wafer patterns, and in particular to algorithms for silicon wafer manufacturing.

BACKGROUND

Integrated circuits (ICs) are produced on semiconductor wafers through multiple steps of depositing, altering, and removing thin layers. Modern semiconductor manufacturing processes may involve over a thousand such processing steps. Advanced process control (APC) aims to optimize settings of processing tools, in order to reduce the total variability of manufacturing. Processing tool settings are also referred to hereinbelow as processing "knobs," and may include any aspect of process control, including process settings for spin-on film, thermal oxide growth, chemical vapor deposition (CVD), physical vapor deposition (PVD), electroplating, wafer temperature, chamber pressure, polishing pressure, etc.

Under certain conditions, traditional process control methods no longer satisfy the ever-increasing level of accuracy required in semiconductor manufacturing. Recent advances in hardware development have introduced a wider range of processing knobs, such that traditional APC solutions have shortcomings when applied to the high dimensional knob space. Yet another APC challenge is that multiple production lines may make use of multiple manufacturing routes, and time scales drifts may increase variability of production results. Attempts to improve APC by applying machine learning techniques have been described. For example, international patent application WO2021/030833, to Drori, et al., titled "Model Based Control of Wafer Non-Conformity," describes several the generation of several types of neural networks correlating processing parameters and metrology data.

The multiple processing steps in semiconductor manufacturing generate stacked structures ("stacks"), which, like diffraction gratings, have optical properties. Optical critical dimension (OCD) metrology involves measuring critical dimensions (CDs) and material properties of patterns at sites on a wafer ("wafer sites") by exploiting these optical properties. (Hereinbelow, CDs and material properties are also referred to as "pattern parameters.") CDs may include the height, width, and pitch of stacks. As described by Dixit, et al., in "Sensitivity analysis and line edge roughness determination of 28-nm pitch silicon fins using Mueller matrix spectroscopic ellipsometry-based optical critical dimension metrology," J. Micro/Nanolith. MEMS MOEMS. 14(3), 031208 (2015), incorporated herein by reference. CDs may also include: side wall angle (SWA), spacer widths, spacer pull-down, epitaxial proximity, footing/undercut, over-fill/under-fill of 2-dimensional (HKMG), 3-dimensional profile (FinFETs) and line edge roughness (LER).

Scatterometric data (also referred to herein as "spectra data") is typically acquired as reflected light radiation that is indicative of optical properties of patterns at wafer sites. U.S. Pat. No. 6,476,920 to Scheiner and Machavariani, "Method and apparatus for measurements of patterned structures," incorporated herein by reference, describes development of an "optical model," also referred to as a "physical model" that estimates scatterometric data that would be measured during spectrographic testing from given pattern parameters. Optical models can also be designed to perform the converse (or "inverse") function, of estimating pattern parameters based on measured scatterometric data. Optical models are commonly applied in OCD metrology to determine whether patterns at wafer sites are being fabricated with correct specifications. Hereinbelow, the more general term "OCD model" refers both to physical models developed from principles of optics and to machine learning models known in the art.

Exemplary scatterometric tools for measuring (acquiring) scatterometric data (e.g., spectrograms) may include spectral ellipsometers (SE), spectral reflectometers (SR), polarized spectral reflectometers, as well as other optical critical dimension (OCD) metrology tools. Such tools are incorporated into OCD metrology systems currently available. One such OCD metrology system is the NOVA T600® Advanced OCD Metrology tool, commercially available from Nova Measuring Instruments Ltd. of Rehovot, Israel, which takes measurements of pattern parameters that may be at designated wafer sites, that is, "in-die." Additional methods for measuring critical dimensions (CDs) include interferometry, X-ray Raman spectrometry (XRS), X-ray diffraction (XRD), and pump-probe tools, among others. Some examples of such tools are disclosed in U.S. Pat. Nos. 10,161,885, 10,054,423, 9,184,102, and 10,119,925, and in international pending patent application publication WO2018/211505, all assigned to the Applicant and incorporated herein by reference in their entirety.

High accuracy methods of measuring pattern parameters that do not rely on the optical models described above include wafer measurements with equipment such as CD scanning electron microscopes (CD-SEMs), atomic force microscopes (AFMs), cross-section tunneling electron microscopes (TEMs), or X-ray metrology tools. These methods are typically more expensive and time-consuming than optical and machine learning modeling methods. Hereinbelow, pattern parameters measured with such tools are referred to as "reference parameters."

Embodiments of the present invention as disclosed hereinbelow help to overcome the shortcomings of current APC methods. It is to be understood that background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to being prior art.

SUMMARY

Embodiments of the present invention provide a system and methods for machine learning based Advance Process Control (APC) in semiconductor manufacturing, including, for each of a plurality of wafer sites, receiving a pre-process set of scatterometric training data, measured before implementation of a processing step, receiving a corresponding post-process set of scatterometric training data measured after implementation of the process step, and receiving a set of process control knob training data indicative of process control knob settings applied during implementation of the process step. A machine learning model may then be trained correlating variations in the pre-process sets of scatterometric training data and the corresponding process control knob training data with the corresponding post-process sets of scatterometric training data, such that the machine learning model is trained to recommend changes to process control knob settings to compensate for variations in the pre-process scatterometric data.

Embodiments of the present invention may further comprise applying the machine learning model to make process control knob recommendations during semiconductor manufacturing.

In further embodiments, the post-process sets of scatterometric training data may be correlated to one or more target, post-process pattern parameters by an optical model. Additionally or alternatively, the post-process sets of scatterometric training data may be correlated to one or more target, post-process pattern parameters by a second machine learning model.

The process control knob settings may include settings for one or more of: a duration of a processing step, a height of a pedestal edge ring, a temperature distribution over multiple control zones of a pedestal, and a process chamber pressure.

The pre-process and post-process sets of scatterometric data may be indicative of one or more pattern parameters at respective wafer sites, including one or more of a critical dimension, a feature depth, a feature height, and a feature pitch.

The processing step may be one or more of a deposition, etching, or polishing operation.

Generating the machine learning model may include training a neural network (NN) including multiple encoder layers leading to a bottleneck latent layer, leading in turn to at least one decoder layer, wherein the pre-process sets of scatterometric training data are applied as model input, wherein the corresponding post-process sets of scatterometric training data are applied as model output, wherein the multiple process control knob training data are applied as auxiliary inputs that intersect the NN at any one of the multiple encoder layers, and wherein the multiple process control knob training data are applied as auxiliary outputs linked to any one of the at least one decoder layer. A loss function for backpropagation of the NN may be configured to maximize a similarity between the outputs of the NN and the post-process sets of scatterometric training data. This loss function may be a square error loss function. The machine learning model may also include a calibration step following the NN that calibrates the post-process sets of scatterometric training data to predicted, post-process pattern parameters. This calibration may be performed by an OCD model.

In further embodiments, an optimization step of the machine learning model may include minimizing a difference between the target, post-process pattern parameters and the predicted, post-process pattern parameters.

A loss function for backpropagation of the NN auxiliary outputs may express a quality of similarity between the auxiliary outputs and the process knob training data. This loss function is a square error loss function.

In further embodiments, generating the machine learning model may include: determining a maximum covariance between the post-process sets of scatterometric training data and the corresponding sets of process control knob training data to generate latent variables; subtracting the process control knob training data from the latent variables to generate corresponding residuals representing a variation contribution of the process control knob training data to variations in the post-process scatterometric training data; calibrating the sets of pre-process scatterometric data to the corresponding residuals to determine knob value estimators of variation in the pre-process scatterometric data; and optimizing the machine learning model to determine the process control knob recommendations from the knob value estimators.

In some embodiments, the multiple wafer sites are located on multiple wafers. The multiple sets of pre-process and post-process scatterometric training data may also be measured by two or more measurement channels.

BRIEF DESCRIPTION OF DRAWINGS

For a better understanding of various embodiments of the invention and to show how the same may be carried into effect, reference is made, by way of example, to the accompanying drawings. Structural details of the invention are shown to provide a fundamental understanding of the invention, the description, taken with the drawings, making apparent to those skilled in the art how the several forms of the invention may be embodied in practice. In the figures.

DETAILED DESCRIPTION

Embodiments of the present invention provide systems and methods for generating machine learning (ML) models for advanced process control (APC) of semiconductor manufacturing. Machine learning (ML), including deep learning (DL) algorithms are potentially a powerful tool in the design of APC and metrology systems. These algorithms fit a multi-dimensional space and can be updated automatically as the process requires. However, the success of any data driven control system is predicated on the availability of accurate data for training. In semiconductor manufacturing, "reference parameters," as described above, are an expensive resource. Hereinbelow, methods for APC are described that facilitate ML and DL techniques without a reliance on such reference parameters.

Figure 1:
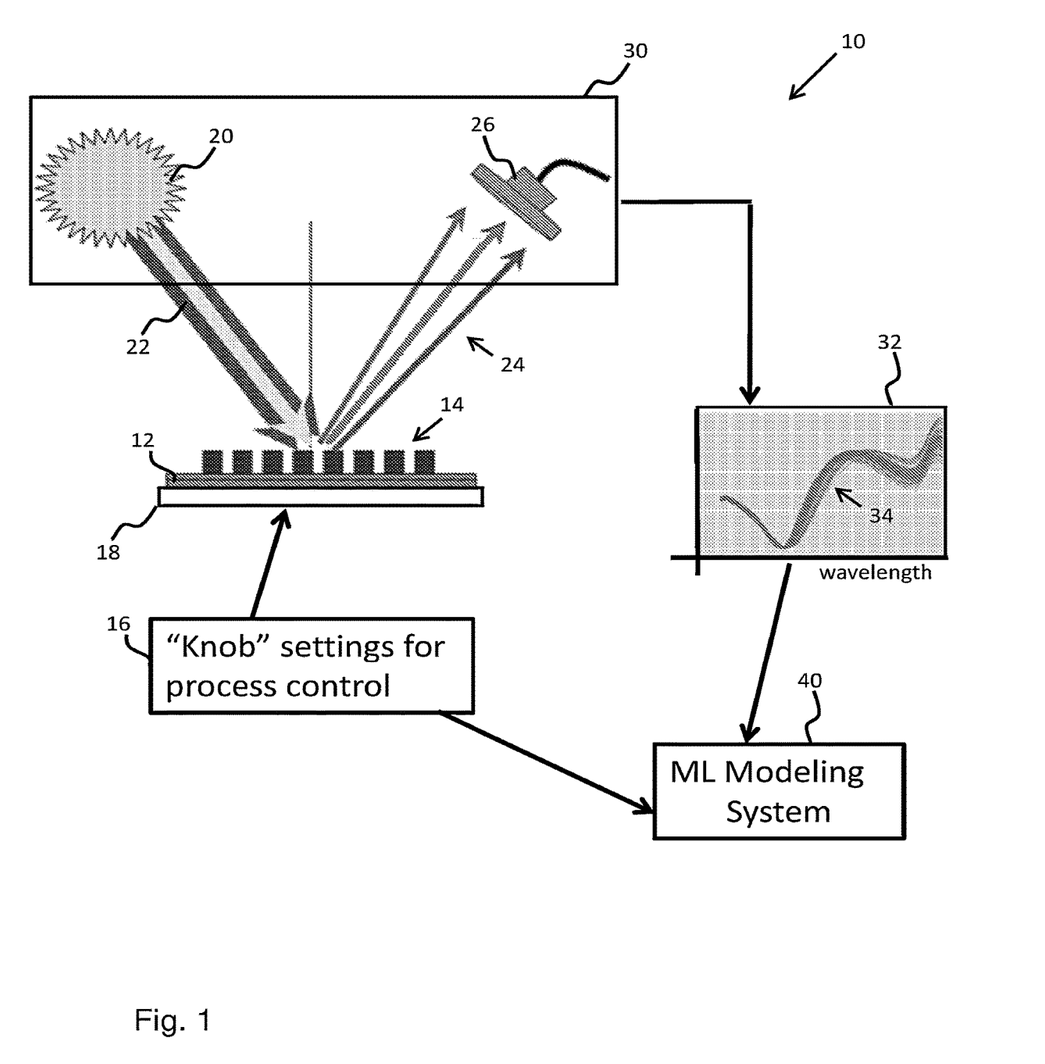
FIG. 1 is a schematic diagram of a system for machine learning based APC, by self-supervised representation learning, in accordance with an embodiment of the present invention.

FIG. 1 is a schematic diagram of a system 10 for semiconductor manufacturing including advanced process control (APC), in accordance with an embodiment of the present invention. The goal of APC is to reduce variations in parameters manufactured at sites on a wafer ("wafer sites").

The system 10 may be a production line for production and monitoring of wafers 12. The wafers 12 are manufactured with wafer sites 14, which have measurable pattern parameters, including one or more of a critical dimension, a feature depth, a feature height, and a feature pitch, as well as other parameters described in the Background above. Typically, wafers have multiple sites, or "dies," that are designed to have the same patterns (i.e., the same pattern design is used to manufacture all of the patterns). For each wafer site 14, a set of multiple pattern parameters may typically be measured. Hereinbelow, this set of multiple parameters is also referred to by a vector p, each element of the vector being one of the multiple parameter CDs.

The system 10 may include a wide range of process control "tools," indicated as process control knob settings 16, which control process conditions. Process control knob settings (also referred to herein as "knob settings" or "knob values") may control, for example, temperature distributions over a pedestal 18, on which a wafer being processed is mounted. Additional knob settings are also typically provided for controlling additional processing parameters including: a duration of a processing step, a height of a pedestal edge ring, a temperature distribution over multiple control zones of a pedestal, and a process chamber pressure. Manufacturing variations cause slight variations in pattern parameters, such that these pattern parameters vary between wafers and at sites across a single wafer after each process step. As described further hereinbelow, embodiments of the present invention provide methods and systems for determining changes that should be made to knob settings in order to reduce variations in parameters at sites within wafers and between wafers. The changes made to the knob settings correct variations in parameters caused by prior process steps. Knob settings that have been established to enrich the dataset used for model training may be referred to as "Design of Experiment" (DOE) knob settings. When recommended variations are determined for knob settings, these recommended knob settings are referred to hereinbelow as $\vec{k}_{recommended}$.

The system 10 includes a light source 20, which generates a beam of light 22 of a predetermined wavelength range. The beam of light 22 is reflected from wafer patterns at a wafer site 14 (indicated as reflected, or "scattered," light 24) towards a spectrophotometric detector 26. In some configurations, the light source and spectrophotometric detector are included in an OCD metrology system 30 (e.g., ellipsometer or a spectrophotometer). The construction and operation of the metrology system 30 may be of any known kind, for example, such as disclosed in U.S. Pat. Nos. 5,517,312, 6,657,736, and 7,169,015, and in international pending patent application publication WO2018/211505, all assigned to the Applicant and incorporated herein by reference in their entirety. Typically the metrology system 30 includes additional components, not shown, such as light directing optics, which may include a beam deflector having an objective lens, a beam splitter and a mirror. Additional components of such systems may include imaging lenses, polarizing lenses, variable aperture stops, and motors. Operation of such elements is typically automated by computer controllers, which may include I/O devices, and which may also be configured to perform data processing tasks, such as generating scatterometric data 32 (also referred to herein as "metrology signals").

The scatterometric data 32 generated by the metrology system 30 typically includes various types of plotted data 34, which may be represented in vector form (e.g., a spectrogram, whose data points are measures of reflected light intensity "I" at different light wavelengths, or a mapping of reflected irradiance vs. incident angle). As described above, variations between sets of scatterometric data are indicative of variations in pattern parameters at the respective wafer sites. In typical OCD metrology, the range of light that is measured may cover the visible light spectrum and may also include wavelengths in ultraviolet and infrared regions. A typical spectrogram output for OCD metrology may have 245 data points covering a wavelength range of 200 to 970 nm.

The metrology signals (i.e., the scatterometric data) include noise originating from different sources. Such noise may be the result of temperature fluctuations and air pressure fluctuations occurring during the measurement process, as well as variations in the state of the metrology system 30, such as variations in optical system alignment, in the determination of the location of a given wafer site on a wafer sample, and in differences between physical and optical states of different metrology systems in use by a manufacturer. The existence of such sources of noise in the scatterometric data affects a determination of, which, in turn, leads to inconsistency in the desired target parameter.

In embodiments of the present invention, a computer system including machine learning (ML) tools known in the art, referred to herein as an ML modeling system 40, may be configured for training an ML model for OCD metrology. Training feature sets (also referred to as feature input) that are used by the ML modeling system may include sets of scatterometric data 34 before and after a given process step is implemented, and data that indicates process control knob settings 16 applied during the process step. After training, the ML model is used to recommend process control knob settings to achieve target pattern parameters.

A process step may include any type of automated processing affecting wafer patterns, such as etching, deposition, or polishing. In further embodiments, the term "process step" may include multiple sub-steps with independent knob settings. The knob vector may include settings for these multiple sub-steps. The ML modeling system 40 may operate independently of the metrology system 30 or may be integrated with the metrology system.

An APC control system aims to minimize process variation of the post-process parameters (for example, those after the process was done) that is a consequence of the pre-process incoming variation and of the process tool non-uniformity. The system calibrates the controlled tool knobs to compensate for incoming wafer site variations that otherwise would affect process uniformity and the achievement of target parameters. Such variations can come at the wafer level (die-to-die), Lot level (wafer-to-wafer) and between lots (lot-2-lot). For example: a chemical mechanical (CMP) process is a major process technique that is repeated dozens of times throughout the long semiconductor manufacturing production line. The CMP tool removes material from a thick layer to form the desired thickness according to desired design. The many CMP process steps and multiple fab routes introduce within wafer variations, which, in turn, need to be corrected by process control. Similarly, an etcher tool selectively removes dielectric or metal materials that have been added during deposition. The compensation of wafer-level variation requires a with-in wafer spatial setting knob, meaning, the ability of the process tool to apply not just a single value per wafer but a full wafer map of the knob. High-end etcher tools offer such controllability, for example, through temperature setup that can be used as a knob to correct this with-in wafer variation. Embodiments of the invention may determine control parameters (e.g., knob settings) for additional semiconductor manufacturing processes relating to, for example, material deposition, removal, patterning such as chemical vapor deposition (CVD), physical vapor deposition (PVD), electroplating, wafer temperature, chamber pressure, polishing pressure, photolithography, etc.

Pattern parameters at wafer sites may be measured by an Optical Critical Dimension (OCD) signal collected by a multi-channel metrology tool, such as a. To accurately learn the sensitivity and response of a knob setting to variations of a wafer's condition and to the desired post target parameter, the ML model's training set requires multiple variations of process conditions that can capture a range of a knob setting's effect on the outcome. Consequently, for the purposes of training the ML model, a process step may be repeated on different wafers by applying different knob settings that vary slightly from DOE knob values. This variation provides a means for capturing the effects of such variations. Hereinbelow, a set of knob values applied to a given process step, to generate training data, is referred to as $\vec{k}_{training}$.

Hereinbelow, a set of scatterometric data generated by a spectrophotometer may be referred to as a scatterometric vector S, where each element of the vector represents a data point of the scatterometric data.

Figure 2:
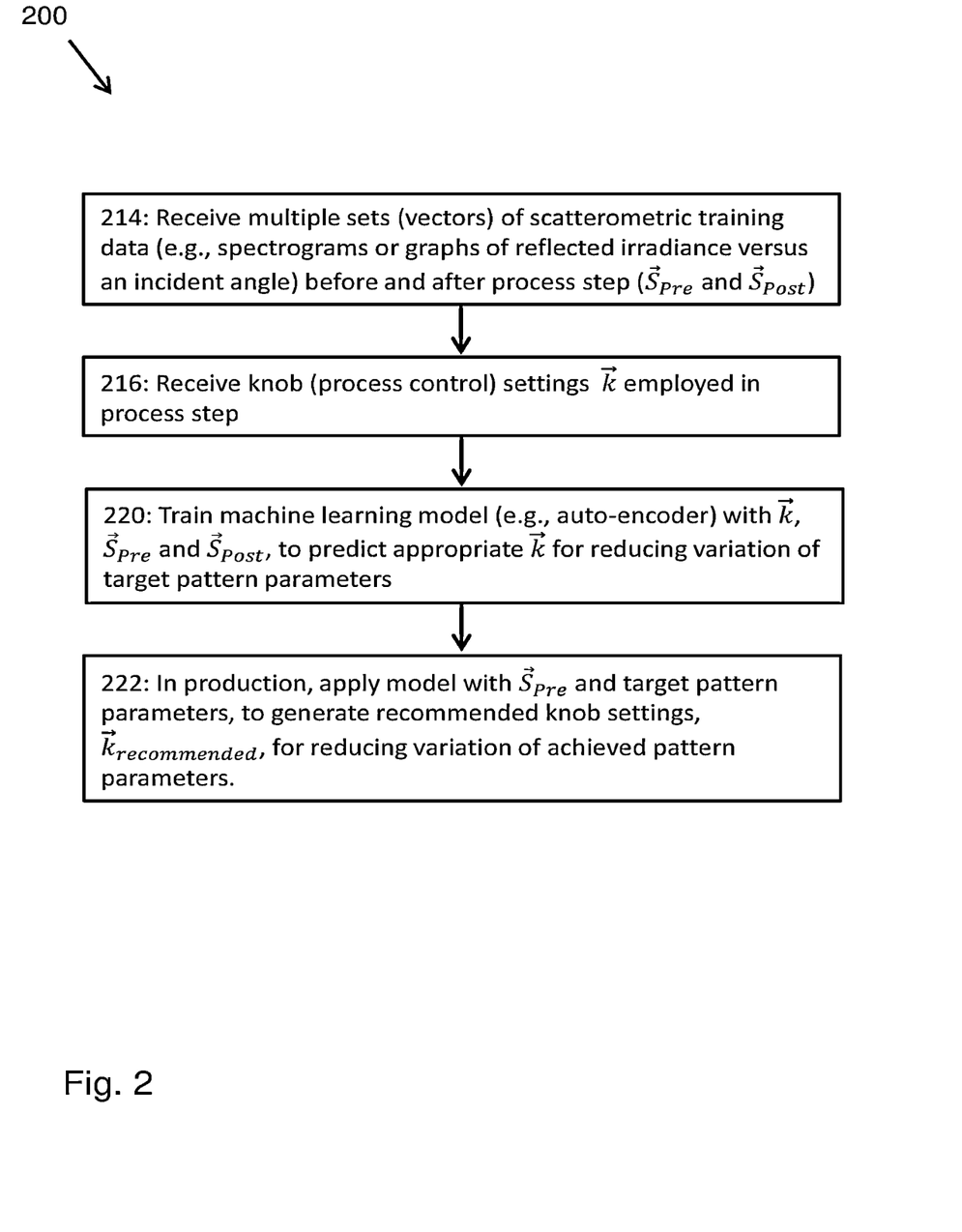
FIG. 2 is a flow diagram depicting a process for machine learning based APC, by self-supervised representation learning, in accordance with an embodiment of the present invention.

FIG. 2 is a flow diagram depicting a computer-implemented process 200 for generating a machine learning model for semiconductor manufacturing APC, in accordance with an embodiment of the present invention. Process 200 may be implemented by the ML modeling system 40, described above. A first step 214 includes receiving multiple sets of scatterometric data for training a machine learning model. A set of scatterometric data measured from a given wafer pattern before a given processing step is referred to as $\vec{S}_{pre}$, while the respective set of scatterometric data measured from the same wafer pattern after the given processing step is referred to as $\vec{S}_{post}$. Typically, a large number of pairs of $\vec{S}_{pre}$ and corresponding $\vec{S}_{post}$ are acquired, in order to effectively implement the subsequent machine learning training. In addition, at a step 216, sets of process control knob data are acquired, each set indicated as a knob vector, $\vec{k}_{DOE:t}$. Each set of process control knob data indicates one or more of the control parameters employed during the given processing step implemented on the wafer pattern that was measured to generate the pair of data sets $\vec{S}_{pre}$ and $\vec{S}_{post}$.

Next, at a step 220, a machine learning model is trained with the data sets of $\vec{k}_{DOE:t}$, $\vec{S}_{pre}$ and $\vec{S}_{post}$, to generate a model for recommending appropriate knob settings (i.e., $\vec{k}_{recommended}$) when pre-process scatterometric data indicate variations in wafer pattern parameters. By varying knob settings, wafer patterns can be manufactured with less variability. As described below, several types of machine learning models may be effective for achieving this goal.

At a step 220, in production, the machine learning model may be applied, by inputting measured $\vec{S}_{pre}$ to generate corresponding recommended knob settings, $\vec{k}_{recommended}$, for reducing variation of post-process pattern parameters.

Figure 3:
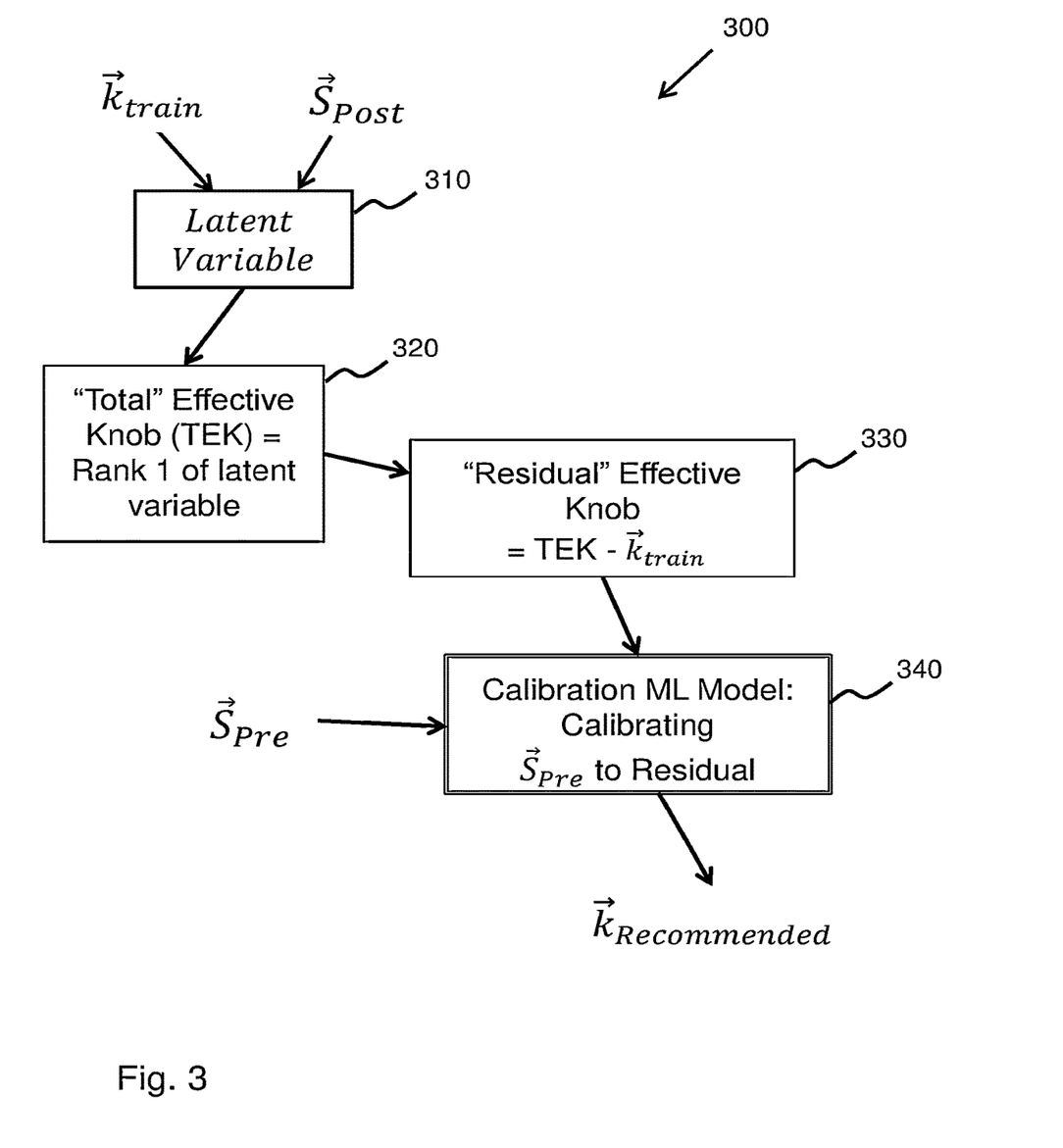
FIGS. 3-6 are schematic diagrams of processes of training and applying machine learning models for APC, in accordance with an embodiment of the present invention.

FIG. 3 depicts a schematic representation of an exemplary machine learning model 300. In this model, the effect (or "signature") of the knob settings is first separated, i.e., isolated, from other sources of variability in the post-process scatterometric data. To achieve such separation, ML techniques that optimize a measure of correlation or covariance between spaces may be employed. For example, the Partial Least Squares (PLS) algorithm finds pairs of components in a two-space dataset and determines a maximum fraction of the covariance between them. We set the two spaces as the post-process scatterometric data, set as X, and the DOE knob settings, $\vec{k}_{DOE}$, set as Y. Based on the maximum covariance principle, X and Y are decomposed into latent variables, indicated as step 310.

Step 320 then extracts the rank 1 variables of this latent space to represent a "total effective knob."

Assuming that the knob settings (based on the DOE values) are the dominant factor in determining the target output, the knob settings can be subtracted from the "total effective knob" (typically represented as a vector) at a step 330. The residual of this subtraction represents a residual contribution of the knob settings to the target parameter. This results in a "residual" effective knob, which can be used in the next step 340, at which the pre-process scatterometric data is calibrated to this residual. The result is a trained estimator that can predict knob values that represent incoming variations (i.e., variations in $\vec{S}_{pre}$), and thus can be used to compensate for these variations.

Figure 4A:
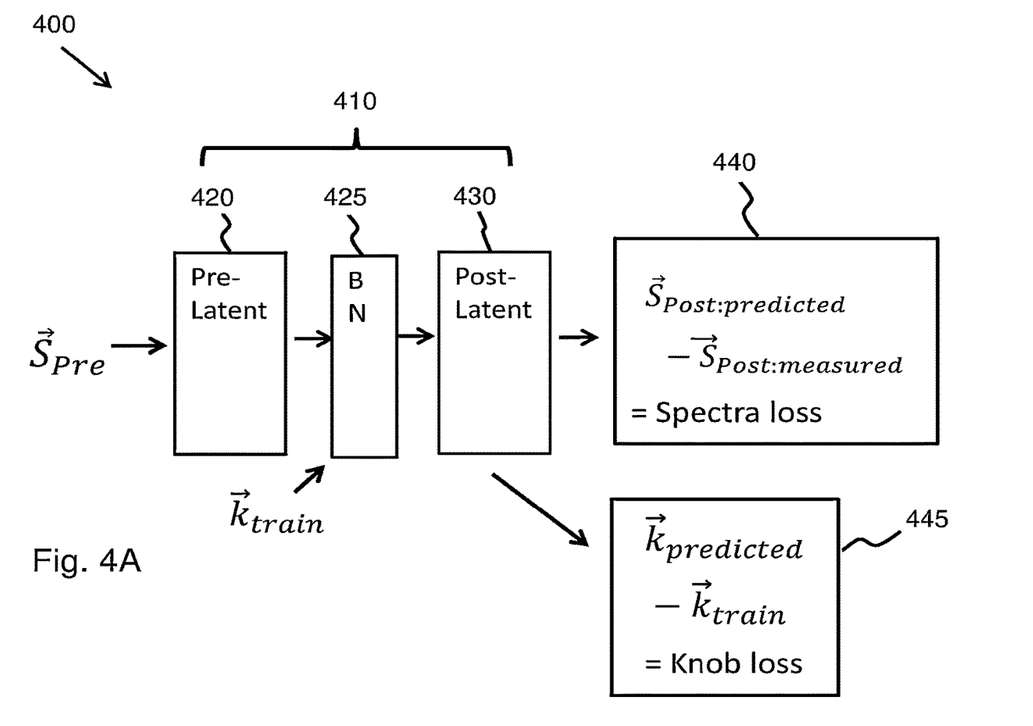
Figure 4B:
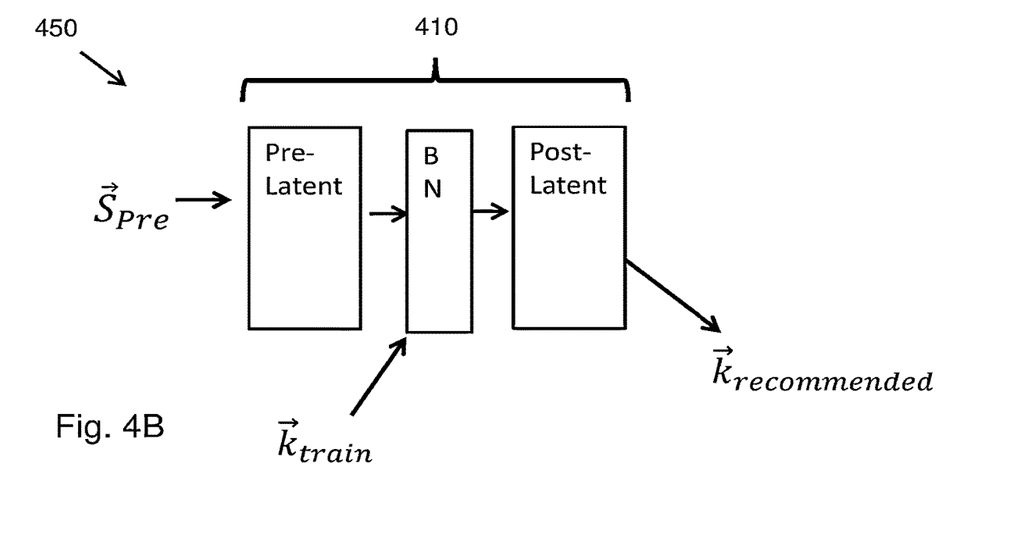

FIGS. 4A and 4B show schematic representations of processes of training and applying ML models for APC. As indicated in FIG. 4A, a training process 400 is applied to train an exemplary ML model 410. The ML model 410 is subsequently applied, as indicated in FIG. 4B, in an inference process 450, during wafer production. The ML model 410 shown is indicative of an unsupervised learning, APC machine learning model that may be based on a deep neural network, in particular an encoder-decoder model 410, according to embodiments of the present invention. As indicated in FIG. 4A, the structure of such a network 410 may consist of three sections, illustrated schematically as an encoder section 420, a "bottleneck" (BN) midsection 425, and a decoder section 430. The encoder 420 compresses the dimensionality of the pre-process spectra (i.e., the pre-process scatterometric data) to a latent structure, and the decoder 430 decompresses the latent structure to the post-process spectra.

The compressed midsection 425 of the network (the "bottleneck," indicated as "BN") typically includes at least two layers: a layer representing the pre-process reduced dimensionality, and a layer represents the post-process spectra dimensionality. Layers between those two layers represent the transfer of the neural network processing between the two latent spaces.

In addition to the main network, an auxiliary input consists of process control knobs settings $\vec{k}_{training}$. This input may intersect the main network at any layer of the encoder (for example, in the figure it is intersecting in the end of the encoder). A second addition to the main network is an auxiliary output linked to the post latent layer in the midsection.

Training of the ML model 410 employs dual loss functions. A first loss function 440 is a spectral loss expressing a quality of similarity between the main network output, indicated as the reconstructed, or predicted, spectra $\vec{S}_{post:predicted}$, and the measured post-process scatterometric data, $\vec{S}_{post:measured}$. This "resemblance" may be measured, for example, by a mean square error loss function.

A second loss function 445 matches the auxiliary output, indicated as the target parameter knob settings, and the implemented process control knob settings, $\vec{k}_{train}$. That is, the second loss function 445 may express a quality of similarity between the auxiliary outputs and the process knob training data.

During the training of the network, the combined loss functions effectively minimize both spectra and knob loss terms. To establish a successful association between the process knob and an auxiliary output "neuron" of the network, the training set should include a designed enhancement of incoming variation using well controlled knobs as well as designed bias of the process knob values. This variation of the knob settings is indicated by the term $\vec{k}_{training}$.

After the network has successfully been trained, the trained ML model 410, as indicated in the process 450 of FIG. 4B, is applied to find recommended knobs values for subsequently processed samples of wafer patterns, in order to reduce variations of target parameters these samples. Recapping the process, the ML training includes: determining a nominal target auxiliary neuron value, and, for each wafer pattern, determining an auxiliary neuron value as a function of an auxiliary input knob value. Subsequently, for each wafer pattern, a knob value that satisfies the desired target parameter is recommended.

Figure 5:
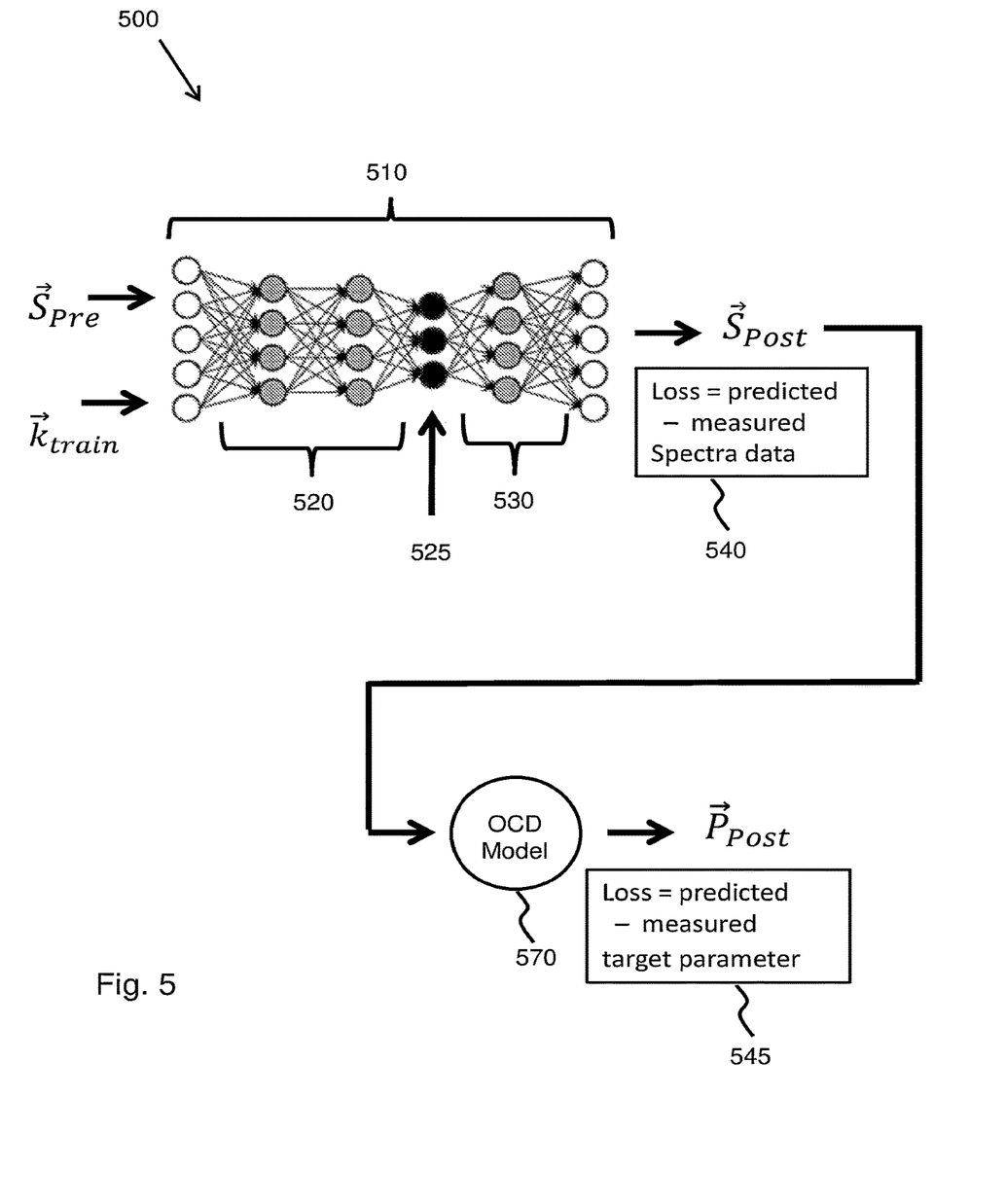

FIG. 5 depicts a process of training a machine learning model 500 that directly transforms a representation of wafer patterns, before and after a process step, and then calibrates the post-process signal (i.e., scatterometric data, $\vec{S}_{post}$) to the target (controlled) parameter, $\vec{P}_{post}$. The model 500 includes an encoder-decoder neural network 510, which has encoder layers 520 that compress the dimensionality of the pre-process signal (i.e., the pre-process scatterometric data), a bottleneck layer 540, and decoder layers 550. The input layer receives the pre-process signal together with the knob settings $\vec{k}_{training}$. These two inputs can be combined in numerous ways, but are typically concatenated. (As described above with respect to FIG. 4, the knob settings $\vec{k}_{training}$ may also be injected at an internal layer of the encoder.) The encoder transforms the input to an optimally reduced bottleneck, for example by a fully connected layer, or by convolution and/or pooling layers. The decoder, in turn, expands the representation of the bottleneck layer through any set of deep network layers (usually symmetric to the encoder, but not necessarily). The output is set to the set of post-process scatterometric data $\vec{S}_{post}$. A loss function 540 may be set as the difference between scatterometric data predicted by the network and a measured set of post-process scatterometric data.

The second part of the ML 500 is a metrology interpretation function, meaning a calibration of the network output (the post-process scatterometric data) to the wafer parameters to be controlled. This calibration, typically by an OCD model 570, uses a second loss term and makes use of labelled data. A second loss term 545 may be set as a difference between the predicted parameters (the output of the OCD model 570) and measured target parameters.

The two loss terms compete on gradient direction during training convergence, meaning that an additional hyperparameter in the form of these loss weights must be tuned.

Figure 6:
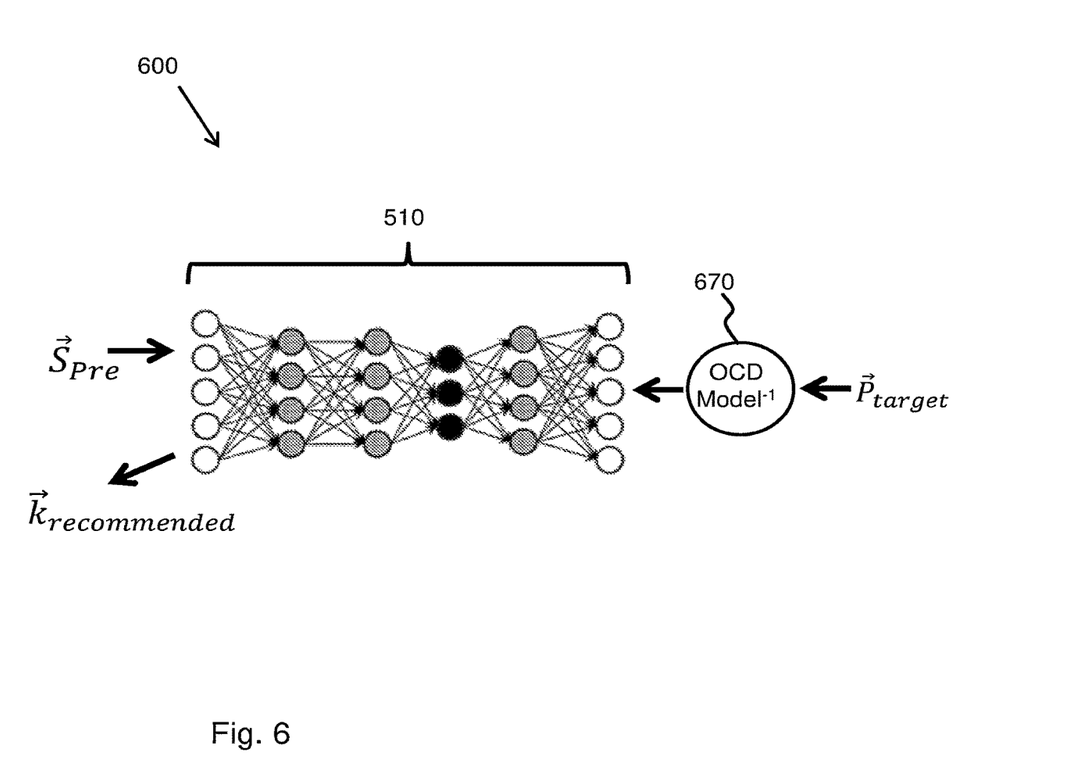

FIG. 6 depicts application of the ML model 500 in production, i.e., for inference, to generate a knob recommendation, $\vec{k}_{recommended}$. An optimization step may be applied to force the model output to be as close as possible to the target parameter. A recommendation $\vec{k}_{recommended}$ may then be achieved by minimizing a distance metric, D. The metric D is a difference between 1) a prediction of pattern parameters made by the model (indicated below as $\hat{P}$), which is based on the pre-process spectra $\vec{S}_{pre}$ and the knob setting, $\vec{k}$, and 2) the target value of the pattern parameter $\vec{P}_{target}$. The value of $\vec{k}_{recommended}$ may then be deduced by the equation:

$$\vec{k}_{recommended} = \mathrm{argmin}_k D\left(\hat{P}\left(\vec{S}_{Pre}, \vec{k}\right), \vec{P}_{target}\right)$$

As indicated in FIG. 6, the operation of the ML model in production includes inputting a new set of pre-process scatterometric data and by keeping the knob input node(s) free for optimization. The run-time optimization step searches for a knob value that minimizes the difference D between the predicted output parameter of the model and a fixed desired target parameter (or parameters). Note that the inverse of the OCD model 570 (indicated as model$^{-1}$ 670) is applied to convert the desired target parameter to the form of a scatterometric vector. The knob value that achieves the minimization of D is the recommended knob value.

Feed-forward machine learning models, such as ML models 410 or 510 may also be trained with additional data inputs, which may enhance the models' capacity to handle variations like tool-to-tool variability and process time drift. The methods presented above compensate for variation originating from multiple possible manufacturing routes, and from the non-uniformity of a process step. Additional factors may introduce further variability and affect process control performance and stability. Such variations may arise, for example, from a tool's momentary physical state, as the physical parts of an active process tool tend to erode over time. Physical processes, like erosion, moving parts, sidewall deposition and residue leftovers, all make the tool's condition, performance and noise signature dynamic. Routine maintenance may be done periodically to reduce this degradation, by cleaning and replacing parts and recalibrating settings. This means that time points in a maintenance cycle of each manufacturing instance are an important factor affecting performance. Additionally, because each tool/chamber in the process is in a unique time position relative to the maintenance point, it introduces another variation to the process, known as 'tool-to-tool' variation (or 'chamber-to-chamber' according to the tool module setup). Records of this time information may be kept in a tool's log. By taking such time information into account in the model input, these time-drift and tool-to-tool variation factors may be reduced.

These variations may be tracked and treated continuously with small modifications of the process tool settings according to feedback from previous performance, such as polishing pressure in a CMP process. These "APC settings" may be implemented frequently, according to the stability of the process. In short, ML training that also employs these tool records as input (i.e., specific instances of processing tools employed, and their maintenance schedules) expands the capability of the ML models to handle these variations, both for within-wafer and for wafer-to-wafer variations.

It is to be understood that processing elements shown or described herein are preferably implemented by one or more computers in computer hardware and/or in computer software embodied in a non-transitory, computer-readable medium in accordance with conventional techniques, such as employing a computer processor, a memory, I/O devices, and a network interface, coupled via a computer bus or alternate connection arrangement.

Unless otherwise described, the terms "processor" and "device" are intended to include any processing device, such as, for example, one that includes a CPU (central processing unit) and/or other processing circuitry (e.g., GPUs), and may refer to more than one processing device. Various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette, tapes), flash memory, etc. Such memory may be considered a computer readable storage medium.

In addition, phrases "input/output devices" or "I/O devices" may include one or more input devices (e.g., keyboard, mouse, scanner, HUD, etc.) for entering data to the processing unit, and/or one or more output devices (e.g., speaker, display, printer, HUD, AR, VR, etc.) for presenting results associated with the processing unit.

Embodiments of the invention may include a system, a method, and/or a computer program product. The computer program product may include a computer readable storage medium (or media) having computer readable program instructions thereon for causing a processor to carry out aspects of the invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), Blue-Ray, magnetic tape, Holographic Memory, a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the invention.

Where aspects of the invention are described herein with reference to flowchart illustrations and/or block diagrams of methods, apparatus (systems), and computer program products according to embodiments of the invention, it will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Any flowchart and block diagrams included herein illustrate the architecture, functionality, and operation of possible implementations of systems, methods, and computer program products according to various embodiments of the invention. In this regard, each block in the flowchart or block diagrams may represent a module, segment, or portion of instructions, which comprises one or more executable instructions for implementing the specified logical function(s). In some alternative implementations, the functions noted in the block may occur out of the order shown herein. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A system for Advance Process Control (APC) in semiconductor manufacturing comprising one or more processors having one or more associated non-transient memories comprising instructions that when executed by the one or more processors implement steps of:
for a plurality of wafer sites,
receiving a pre-process set of scatterometric training data, measured before implementation of a processing step,
receiving a corresponding post-process set of scatterometric training data measured after implementation of the process step, and
receiving a set of process control knob training data indicative of process control knob settings applied during implementation of the process step; and
generating a machine learning model correlating variations in the pre-process sets of scatterometric training data and the corresponding process control knob training data with the corresponding post-process sets of scatterometric training data, to train the machine learning model to recommend changes to process control knob settings to compensate for variations in the pre-process scatterometric data:
wherein the generating of the machine learning model comprises training a neural network (NN), including multiple encoder layers wherein the pre-process sets of scatterometric training data are applied as model input, wherein the corresponding post-process sets of scatterometric training data are applied as model output, wherein the multiple process control knobs training data are applied as auxiliary inputs that intersect the NN at any one of the multiple encoder layers;
wherein the generating of the machine learning model comprises applying a pair of loss functions for backpropagation of the NN, wherein a first loss function of the pair maximizes a similarity between outputs of the NN and the post-process scatterometric training data, and a second loss function of the pair expresses a quality of similarity between auxiliary outputs and the set of process knob training data.

2. The system of claim 1, wherein the steps further comprise applying the machine learning model to make process control knob recommendations during semiconductor manufacturing.

3. The system of claim 1, wherein the scatterometric training data includes a spectral data.

4. The system of claim 1, wherein the process control knob settings include settings for one or more of: a duration of a processing step, a height of a pedestal edge ring, a temperature distribution over multiple control zones of a pedestal, and a process chamber pressure.

5. The system of claim 1, wherein each of the pre-process and post-process sets of scatterometric data are indicative of one or more pattern parameters at respective wafer site, including one or more of a critical dimension, a feature depth, a feature height, a feature pitch, a side wall angle (SWA), a spacer widths, a spacer pull-down, an epitaxial proximity, a footing/undercut, an over-fill/under-fill, a 3-dimensional profile and line edge roughness (LER).

6. The system of claim 1, wherein the processing step is one or more of a deposition, etching, or polishing operation.

7. The system of claim 1, wherein the first loss function and the second loss functions are square error loss functions.

8. The system of claim 1, wherein the machine learning model includes a calibration step following the NN that calibrates the post-process sets of scatterometric training data to predicted, post-process pattern parameters, wherein the calibration is performed by an optical critical dimension (OCD) model.

9. The system of claim 8, wherein an optimization step of the machine learning model includes minimizing a difference between the target, post-process pattern parameters and the predicted, post-process pattern parameters.

10. A method for Advance Process Control (APC) in semiconductor manufacturing comprising:
for a plurality of wafer sites,
receiving a pre-process set of scatterometric training data, measured before implementation of a processing step,
receiving a corresponding post-process set of scatterometric training data measured after implementation of the process step, and
receiving a set of process control knob training data indicative of process control knob settings applied during implementation of the process step; and
generating a machine learning model correlating variations in the pre-process sets of scatterometric training data and the corresponding process control knob training data with the corresponding post-process sets of scatterometric training data, to train the machine learning model to recommend changes to process control knob settings to compensate for variations in the pre-process scatterometric data:
wherein the generating of the machine learning model comprises training a neural network (NN) including multiple encoder, wherein the pre-process sets of scatterometric training data are applied as model input, wherein the corresponding post-process sets of scatterometric training data are applied as model output, wherein the multiple process control knob training data are applied as auxiliary inputs that intersect the NN at any one of the multiple encoder layers;
wherein the generating of the machine learning model comprises applying a pair of loss functions for backpropagation of the NN, wherein a first loss function of the pair maximizes a similarity between outputs of the NN and the post-process scatterometric training data, and a second loss function of the pair expresses a quality of similarity between auxiliary outputs and the set of process knob training data.

11. The method of claim 10, wherein the steps further comprise applying the machine learning model to make process control knob recommendations during semiconductor manufacturing.

12. The method of claim 10, wherein the machine learning model is a first machine learning model and wherein the post-process sets of scatterometric training data are correlated to one or more target, post-process pattern parameters by an optical model or by a second machine learning model.

13. The method of claim 10, wherein the process control knob settings include settings for one or more of: a duration of a processing step, a height of a pedestal edge ring, a temperature distribution over multiple control zones of a pedestal, and a process chamber pressure.

14. The method of claim 10, wherein each of the pre-process and post-process sets of scatterometric data are indicative of one or more pattern parameters at respective wafer site, including one or more of a critical dimension, a feature depth, a feature height, a feature pitch, a side wall angle (SWA), a spacer widths, a spacer pull-down, an epitaxial proximity, a footing/undercut, an over-fill/under-fill of 2-dimensional (HKMG), a 3-dimensional profile (FinFETs) and line edge roughness (LER).

15. The method of claim 10, wherein the processing step is one or more of a deposition, etching, or polishing operation.

16. The method of claim 10, wherein the scatterometric training data includes a spectral data.

17. The method of claim 10, wherein the machine learning model includes a calibration step following the NN that calibrates the post-process sets of scatterometric training data to predicted, post-process pattern parameters, wherein the calibration is performed by an optical critical dimension (OCD) model.

18. A non-transitory, machine-accessible storage medium having instructions stored thereon, the instructions, when executed by a machine, causing the machine to implement steps of:
  for a plurality of wafer sites,
    receiving a pre-process set of scatterometric training data, measured before implementation of a processing step,
    receiving a corresponding post-process set of scatterometric training data measured after implementation of the process step, and
    receiving a set of process control knob training data indicative of process control knob settings applied during implementation of the process step; and generating a machine learning model correlating variations in the pre-process sets of scatterometric training data and the corresponding process control knob training data with the corresponding post-process sets of scatterometric training data, to train the machine learning model to recommend changes to process control knob settings to compensate for variations in the pre-process scatterometric data: wherein the generating of the machine learning model comprises training a neural network (NN) including multiple encoder, wherein the pre-process sets of scatterometric training data are applied as model input, wherein the corresponding post-process sets of scatterometric training data are applied as model output, wherein the multiple process control knob training data are applied as auxiliary inputs that intersect the NN at any one of the multiple encoder layers;

wherein the generating of the machine learning model comprises applying a pair of loss functions for backpropagation of the NN, wherein a first loss function of the pair maximizes a similarity between outputs of the NN and the post-process scatterometric training data, and a second loss function of the pair expresses a quality of similarity between auxiliary outputs and the set of process knob training data.

\* \* \* \* \*